(12) United States Patent
Thorp et al.

(10) Patent No.: US 8,125,822 B2
(45) Date of Patent: *Feb. 28, 2012

(54) REDUCING PROGRAMMING TIME OF A MEMORY CELL

(75) Inventors: Tyler Thorp, Palo Alto, CA (US); Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 51 days.

This patent is subject to a terminal disclaimer.

(21) Appl. No.: 12/551,548

(22) Filed: Aug. 31, 2009

(65) Prior Publication Data

US 2011/0051505 A1  Mar. 3, 2011

(51) Int. Cl.
G11C 7/06 (2006.01)
(52) U.S. Cl. .......................... 365/163; 365/148
(58) Field of Classification Search .................. 365/105, 365/229
See application file for complete search history.

(56) References Cited

U.S. PATENT DOCUMENTS

| | | | |
|---|---|---|---|
| 5,737,259 A * | 4/1998 | Chang | 365/105 |
| 5,982,659 A * | 11/1999 | Irrinki et al. | 365/168 |
| 6,191,972 B1 * | 2/2001 | Miura et al. | 365/171 |
| 6,545,898 B1 | 4/2003 | Scheuerlein | |
| 6,618,295 B2 | 9/2003 | Scheuerlein | |
| 6,625,054 B2 | 9/2003 | Lowrey et al. | |
| 6,822,903 B2 | 11/2004 | Scheuerlein et al. | |
| 6,963,504 B2 | 11/2005 | Scheuerlein et al. | |
| 7,283,387 B2 * | 10/2007 | Cho et al. | 365/163 |
| 7,577,024 B2 * | 8/2009 | Fackenthal et al. | 365/163 |
| 7,813,167 B2 | 10/2010 | Porter | |
| 7,869,260 B2 * | 1/2011 | Ueda | 365/148 |
| 7,889,537 B2 * | 2/2011 | Edahiro et al. | 365/148 |
| 2006/0166455 A1 | 7/2006 | Gordon | |
| 2009/0052227 A1 | 2/2009 | Edahiro | |
| 2009/0207647 A1 | 8/2009 | Maejima | |

FOREIGN PATENT DOCUMENTS

WO  WO 2008-013619  1/2008

OTHER PUBLICATIONS

Thorp et al., U.S. Appl. No. 12/551,546, filed Aug. 31, 2009.
Thorp et al., U.S. Appl. No. 12/551,553, filed Aug. 31, 2009.
Lee et al., "A 90nm 1.8V 512Mb Diode-Switch PRAM with 266MB/s Read Throughput", Feb. 14, 2007; 2007 IEEE International Solid-State Circuits Conference, Session 26/Non-Volatile Memories/26.1, pp. 472, 473 and 616.

(Continued)

*Primary Examiner* — Tan T. Nguyen
(74) *Attorney, Agent, or Firm* — Dugan & Dugan, PC

(57) ABSTRACT

The present invention provides methods and apparatus for adjusting voltages of bit and word lines to program a two terminal memory cell. The invention may include setting a first line connected to a memory cell to a first voltage from a first line standby voltage, charging a second line connected to the memory cell to a predetermined voltage from a second line standby voltage, and switching the first line from the first voltage to a second voltage. The voltage difference between the first voltage and the predetermined voltage is such that a safe voltage results that does not program the memory cell. A voltage difference between the second voltage and the predetermined voltage is such that a programming voltage operative to program the memory cell results.

24 Claims, 4 Drawing Sheets

OTHER PUBLICATIONS

Hanzawa et al., "A 512kB Embedded Phase Change Memory with 416kB/s Write Throughput at 100μA Cell Write Current", 2007 IEEE International Solid-State Circuits Conference, Session 26/Non-Volatile Memories/26.2, pp. 474, 475 and 616.

Notice of Allowance of U.S. Appl. No. 12/551,546 mailed Jun. 21, 2011.

Partial International Search of related International Application No. PCT/US2010/045684 Annex to invitation to pay additional fees dated Nov. 18, 2010.

International Search Report and Written Opinion of related International Application No. PCT/US2010/045684 Jan. 31, 2011.

Notice of Allowance of U.S. Appl. No. 12/551,546 mailed Apr. 15, 2011.

Restriction Requirement of related U.S. Appl. No. 12/551,553 mailed Nov. 25, 2011.

Dec. 19, 2011 Reply to Nov. 25, 2011 Restriction Requirement of related U.S. Appl. No. 12/551,553.

\* cited by examiner

REDUCING PROGRAMMING TIME OF A MEMORY CELL

CROSS REFERENCE TO RELATED APPLICATIONS

The present application is related to the following patent applications, which are hereby incorporated by reference herein in their entirety for all purposes:

U.S. patent application Ser. No. 12/551,546, filed 31 Aug. 2009, and titled "CREATING SHORT PROGRAM PULSES IN ASYMMETRIC MEMORY ARRAYS;" and U.S. patent application Ser. No. 12/551,553, filed 31 Aug. 2009, and titled "FLEXIBLE MULTI-PULSE SET OPERATION FOR PHASE-CHANGE MEMORIES."

FIELD OF THE INVENTION

The present invention relates generally to integrated circuits containing memory arrays, and more particularly, to reducing the programming time of memory cells of such arrays.

BACKGROUND OF THE INVENTION

Conventionally, memory performance is affected by the need to limit the amount of current used to program memory cells. If too much current is applied to a memory cell, the memory cell may be damaged. However, limiting the amount of current used to program the memory cell increases the amount of time needed to program the cell. Thus, what are needed are methods and apparatus for quickly programming memory cells without risking damage to the memory cells.

SUMMARY OF THE INVENTION

In a first aspect of the invention, a method of programming a two terminal memory cell may be provided. The method may include applying a first voltage to a first line coupled to a first terminal of the memory cell from a first line standby voltage; applying a predetermined voltage to a second line coupled to a second terminal of the memory cell from a second line standby voltage; and switching the first voltage to a second voltage. A voltage drop across the first and second terminals of the memory cell when the first voltage is applied is a safe voltage that does not program the memory cell. A voltage drop across the first and second terminals of the memory cell, after the first voltage is switched to the second voltage, is a programming voltage that is sufficient to program the memory cell.

In a second aspect of the invention, a method of programming a two terminal memory cell may be provided. The method may include connecting to a control circuit, a first line connected to the memory cell; setting via the control circuit the first line to a first voltage from a first line standby voltage; connecting to a sense amplifier, a second line connected to the memory cell; charging via the sense amplifier the second line to a predetermined voltage from a second line standby voltage; and switching via the control circuit the first line connected to the memory cell from the first voltage to a second voltage. A voltage drop across the memory cell when the first line is set to the first voltage is a safe voltage that does not program the memory cell. A voltage drop across the memory cell, after the first line is switched from the first voltage to the second voltage, is a programming voltage that is sufficient to program the memory cell.

In a third aspect of the invention, a method of programming a two terminal memory cell may be provided. The method may include providing a memory cell; providing a first line connected to the memory cell; providing a first line driver connected to the first line; providing a first line select to control the first line driver; providing a control circuit selectively connected to the first line through the first line driver when the first line select is enabled, the control circuit to set the first line to a first voltage from a first line standby voltage; providing a second line connected to the memory cell; providing a second line driver connected to the second line; providing a second line select to control the second line driver; and providing a sense amplifier selectively connected to the second line through the second line driver when the second line select is enabled, the sense amplifier operative to charge the second line to a predetermined voltage from a second line standby voltage. The control circuit switches the first line from the first voltage to the second voltage. A voltage drop across the memory cell, when the first line is set to the first voltage, is a safe voltage that does not program the memory cell. A voltage drop across the memory cell, after the first line is switched from the first to the second voltage, is a programming voltage that is sufficient to program the memory cell.

In a fourth aspect of the invention, a control circuit and sense amplifier combination operative to program a two terminal memory cell may be provided. The control circuit and sense amplifier combination may include a first line connection outputting a first voltage; and a second line connection outputting a predetermined voltage. The first line connection is switchable to output a second voltage. A voltage drop between the first voltage and the predetermined voltage is a safe voltage. A voltage drop between the second voltage and the predetermined voltage is a programming voltage.

In a fifth aspect of the invention, a device operative to program a two terminal memory cell may be provided. The device may include a control circuit to output a first voltage; and a sense amplifier to output a predetermined voltage. The control circuit switches the first voltage to a second voltage. The first voltage combined with the predetermined voltage is a safe voltage. The second voltage combined with the predetermined voltage is a programming voltage.

In a sixth aspect of the invention, a device operative to program a two terminal memory cell may be provided. The device may include a control circuit selectively connected to a first line through a first line driver when a first line select is enabled, the control circuit to set the first line to a first voltage from a first line standby voltage; and a sense amplifier selectively connected to a second line through a second line driver when a second line select is enabled, the sense amplifier operative to charge the second line to a predetermined voltage from a second line standby voltage. The control circuit switches the first line from the first voltage to a second voltage. The first voltage combined with the predetermined voltage is a safe voltage. The second voltage combined with the predetermined voltage is a programming voltage.

In a seventh aspect of the invention, a memory array including a two terminal memory cell may be provided. The memory array may include the memory cell; a first line connected to the memory cell being set to a first voltage from a first line standby voltage; and a second line connected to the memory cell being charged to a predetermined voltage from a second line standby voltage. The first line is switched from the first voltage to a second voltage. The first voltage combined with the predetermined voltage is a safe voltage that does not program the memory cell. The second voltage combined with the predetermined voltage is a programming voltage operative to program the memory cell.

In an eighth aspect of the invention, a memory array including a two terminal memory cell may be provided. The memory array may include the memory cell; a first line connected to the memory cell; a control circuit connected to the first line setting the first line to a first voltage from a first line standby voltage and switching to a second voltage; a second line connected to the memory cell; and a sense amplifier setting the second line to a predetermined voltage from a second line standby voltage. The first voltage combined with the predetermined voltage is a safe voltage that does not program the memory cell. The second voltage combined with the predetermined voltage is a programming voltage operative to program the memory cell.

In a ninth aspect of the invention, a memory array including a two terminal memory cell may be provided. The memory array may include the memory cell; a first line connected to the memory cell; a first line driver connected to the first line; a first line select to control the first line driver; a control circuit selectively connected to the first line through the first line driver when the first line select is enabled, the control circuit to set the first line to a first voltage from a first line standby voltage; a second line connected to the memory cell; a second line driver connected to the second line; a second line select to control the second line driver; and a sense amplifier selectively connected to the second line through the second line driver when the second line select is enabled, the sense amplifier to charge the second line to a predetermined voltage from a second line standby voltage. The control circuit switches the first line from the first voltage to a second voltage. The first voltage combined with the predetermined voltage is a safe voltage that does not program the memory cell. The second voltage combined with the predetermined voltage is a programming voltage operative to program the memory cell.

Other features and aspects of the present invention will become more fully apparent from the following detailed description, the appended claims and the accompanying drawings.

DETAILED DESCRIPTION

Figure 1:
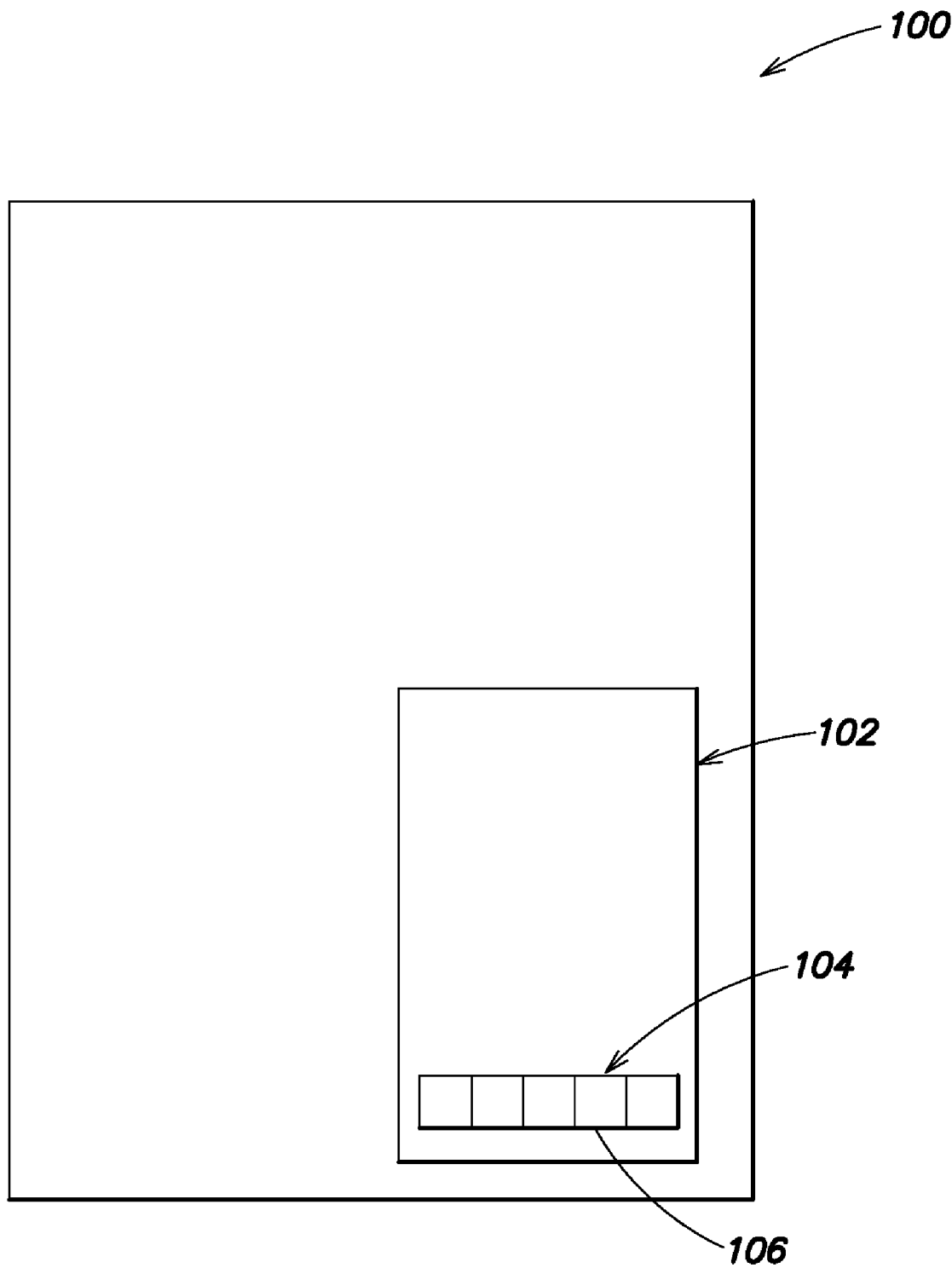
FIG. 1 is a schematic representation of an electronic device according to an embodiment of the present invention.

Reference will now be made in detail to embodiments of the present invention, examples of which are illustrated in the accompanying drawings, wherein like reference numerals refer to the like elements throughout. The embodiments are described below to explain the present invention by referring to the figures.

As used herein, the terms "a", "an" and "the" may refer to one or more than one of an item. The terms "and" and "or" may be used in the conjunctive or disjunctive and will generally be understood to be equivalent to "and/or". For brevity and clarity, a particular quantity of an item may be described or shown while the actual quantity of the item may differ.

Initially, it should be noted that the term voltage should be broadly interpreted to include the phrase "programming energy".

In accordance with an embodiment of the present invention, voltages of both a bit line and a word line may be adjusted to program a memory cell. Voltages of the bit line and the word line may initially be at standby voltages. Voltages of a word line may switch between a first voltage and a second voltage. The first voltage (e.g., 3 volts) may be high enough relative to the voltage applied to the bit line (e.g., 8 volts), that a net voltage (e.g., 5 volts) may result that may be less than a voltage that may program the memory cell. That is, the first voltage may result in a safe voltage. Using the voltage of the word line to adjust the net voltage to be less than a voltage that may program the memory cell is counter-intuitive in that conventionally the voltage of the bit line is used to control the net voltage. The second voltage (e.g., 0 volts) may be low enough relative to the voltage applied to the bit line (e.g., 8 volts), that a net voltage (e.g., 8 volts) may result that is effective to program the memory cell (i.e., a programming voltage). Thus, by switching from the safe voltage to the programming voltage (e.g., instead of switching from the standby voltage to the programming voltage), a much smaller voltage change may be used during programming that does not require the current to be limited.

FIG. 1 is a schematic representation of an electronic device 100 according to an embodiment of the present invention. The electronic device 100 may include an integrated circuit 102. The integrated circuit 102 may include a memory array 104. The memory array 104 may include a memory cell 106. The memory cell 106 is shown as part of the memory array 104 which is shown as part of the integrated circuit 102 which is shown as part of the electronic device 100. However, the electronic device 100 may otherwise access memory cells 106.

The electronic device 100 may include any of a variety of known or later-developed electronic devices that include or access memory cells 106. For example and not by way of limitation, the electronic device 100 may include a flash drive, a digital audio player, or a portable computer.

Figure 2A:
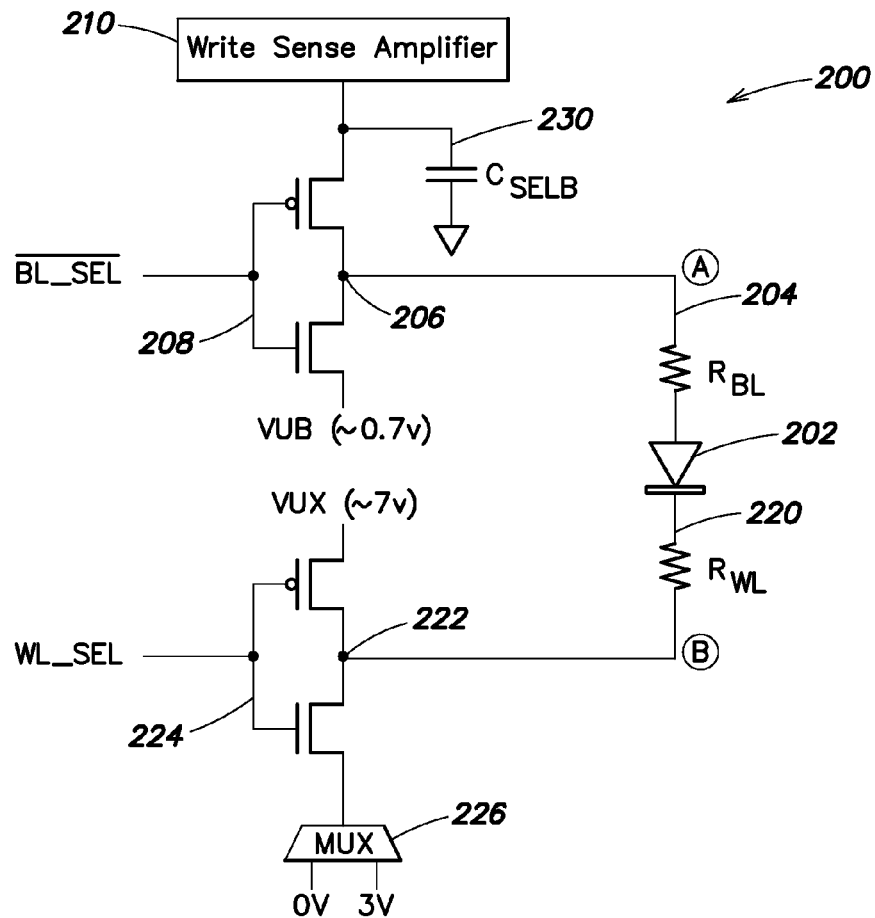
FIG. 2A is a schematic representation of a memory array, such as the memory array of FIG. 1.

FIG. 2A is a schematic representation of a memory array 200, such as the memory array 104 of FIG. 1. The memory array 200 may include a memory cell 202, a bit line 204, a bit line driver 206, a bit line select 208, a sense amplifier 210, a word line 220, a word line driver 222, a word line select 224, a control circuit 226, and a capacitor 230.

The memory cell 202 may be formed of any of a variety of known or later-developed materials. For example and not by way of limitation, the memory cell 202 may be formed of chalcogenide/PVM or chalcogenide-type materials. The memory cell 202 may be a two-terminal memory cell. The memory cell 202 may include an isolation unit. The isolation unit may include a diode including an anode and a cathode. The anode side may be sensed. The cathode side may be controlled. Alternatively, the anode side may be controlled, and the cathode side may be sensed.

The memory cell 202 may be connected to the bit line 204. The bit line 204 may be coupled to a terminal on the anode side of the memory cell 202. That is, the bit line may be on the sensed side. The bit line 204 may be long relative to the word line 220. The bit line 204 may be connected to the bit line driver 206. The bit line driver 206 may be controlled by the bit line select 208. When the bit line select 208 is enabled, it may connect the bit line 204 to the sense amplifier 210. The bit line driver 206 may be enabled or disabled based on a charge of the capacitor 230.

The memory cell 202 may be connected to the word line 220. The word line 220 may be coupled to a terminal on the cathode side of the memory cell 202. That is, the word line may be on the side that is controlled. The word line 220 may be connected to the word line driver 222. The word line driver 222 may be controlled by the word line select 224. When the word line select 224 is enabled, it may connect the word line 220 to the control circuit 226. The word line 220 may be shorted together with another word line so that word lines are shared.

The sense amplifier 210 may be a write sense amplifier. As will be described further below, the sense amplifier 210 may control programming of the memory cell 202 in conjunction with the control circuit 226.

The control circuit 226 may include a dedicated regulator (e.g., a MUX). The control circuit 226 may control the amount of voltage applied to the word line 220. The control circuit 226 may switch between two voltages.

It should be noted that the word line and the bit line may be switched between more than two voltages, such as from standby voltages to, for example, a first voltage and to a second voltage. Examples of standby voltages are described in U.S. Pat. Nos. 6,822,903 and 6,963,504, both to Scheuerlein and Knall, and both entitled "APPARATUS AND METHOD FOR DISTURB-FREE PROGRAMMING OF PASSIVE ELEMENT MEMORY CELLS", both of which are incorporated by reference herein in their entirety for all purposes. In these examples, first and second array lines may be driven to selected bias voltages. Then, the first and second array lines may be driven to unselected bias voltages. The timing of when the first and second array lines may be driven to selected bias voltages and when the first and second array lines may be driven to unselected bias voltages may be adjusted relative to one another (i.e., the first array line relative to the second array line), for example, to prevent unintended programming of cells located near target cells in an array. It should be appreciated that in the present disclosure, such standby voltages should not be confused with the first voltage (i.e., as discussed below, the voltage that, when coupled with the voltage applied to the bit line, results in a safe voltage).

The first voltage (e.g., 3 volts) may be high enough that when coupled with voltage applied to the bit line 204 (e.g., 8 volts), may result in a net voltage (e.g., 5 volts) that may be less than a voltage that may program the memory cell 202. That is, the first voltage may result in a safe voltage. The second voltage (e.g., 0 volts) may be low enough that when coupled with voltage applied to the bit line 204 (e.g., 8 volts), may result in a net voltage (e.g., 8 volts) effective to program the memory cell 202. That is, the second voltage may result in a programming voltage.

Alternatively, the control circuit 226 may include a diode connected NMOS device and a bypass path. The diode connected NMOS device may generate the first voltage (i.e., the safe voltage). The bypass path, when selected, may generate the second voltage (resulting in the programming voltage).

The actual value of the first and second voltages may be determined based upon multiple considerations. One consideration may be that the difference between the two voltages should be sufficient to distinguish between programming and not programming. Another consideration may be that the smaller the difference between the two voltages is, the faster the programming of the memory cell 202 may be.

Figure 2B:
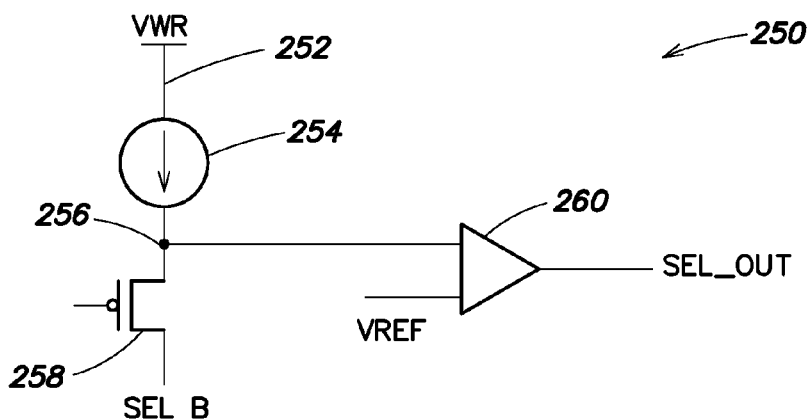
FIG. 2B is a schematic representation of a sense amplifier, such as the sense amplifier of FIG. 2A.

FIG. 2B is a schematic representation of a sense amplifier 250, such as the sense amplifier 210 of FIG. 2A. The sense amplifier 250 may be a write sense amplifier. The sense amplifier 250 may control programming of the memory cell 202 in conjunction with the control circuit 226. The sense amplifier 250 may include a voltage 252, a current limiter 254, a node 256, a pMOS 258, and a voltage reference 260.

The voltage 252 may flow through the current limiter 254, the node 256, and the pMOS 258. The current limit may limit to a predetermined amount (e.g., 1 microamp). The voltage 252 may be compared with the voltage reference 260. Once the memory cell 202 programs, the voltage 252 flowing through the node 256 may fall.

Figure 3:
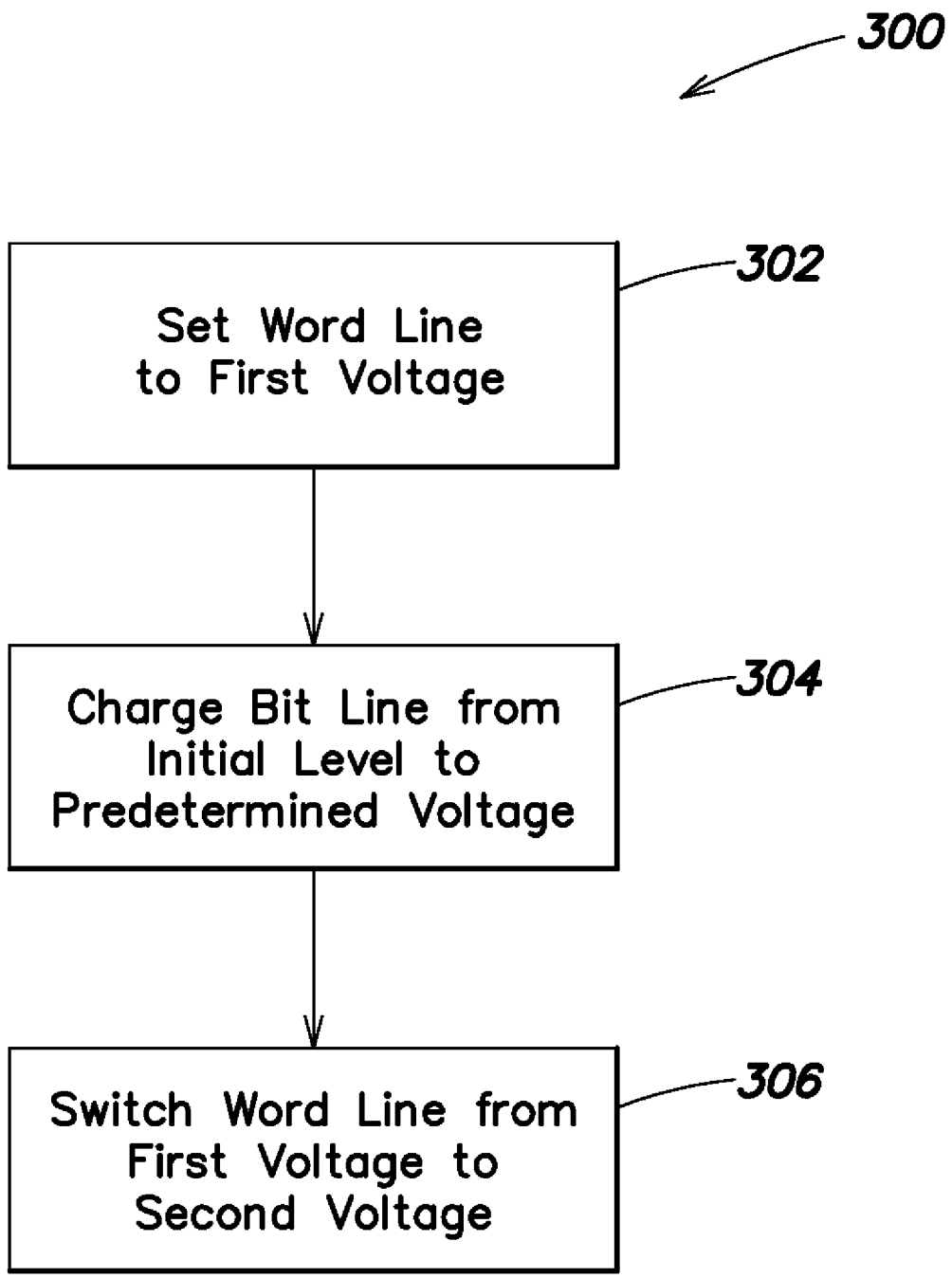
FIG. 3 is a flowchart of an exemplary method of programming a memory cell according to an embodiment of the present invention.
Figure 4:
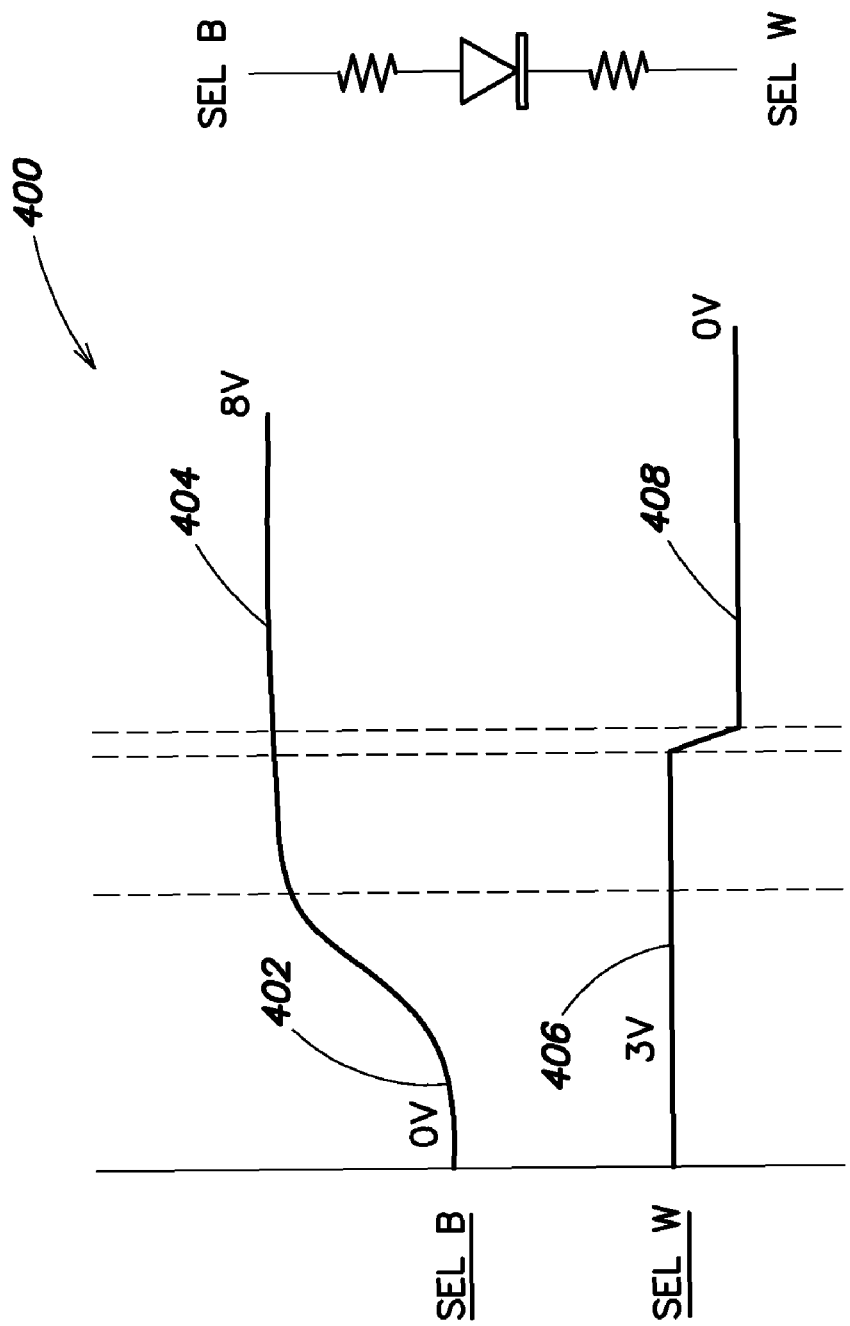
FIG. 4 is a schematic representation of voltages of a bit line and a word line according to an embodiment of the present invention.

The operation of the memory array 200 is now described with reference to FIGS. 3 and 4, which illustrate, respectively, an exemplary method 300 of programming a memory cell 202, and voltages 400 of a bit line 204 and a word line 220.

In operation 302, the word line 220 may be set to a first voltage 406. For example and not by limitation, the voltage of the word line 220 may be set to 3 volts. The word line select 224 may be enabled thereby connecting the word line 220 through the word line driver 222 to the control circuit 226.

In operation 304, the bit line 204 may be charged from an initial level 402 to a predetermined voltage 404. For example and not by limitation, the bit line 204 may be charged from an initial level of 0 volts to a predetermined voltage of 8 volts. The bit line 204 may be charged from the initial level 402 to the predetermined voltage 404 quickly and without limitation. The bit line select 208 may be enabled thereby connecting the bit line 204 through the bit line driver 206 to the sense amplifier 210.

The first voltage 406 of the word line (e.g., 3 volts) may be high enough that relative to the predetermined voltage 404 of the bit line 204 (e.g., 8 volts), a net voltage difference results (e.g., 5 volts) that may be less than a voltage needed to program the memory cell 202. That is, the first voltage 406 may result in a safe voltage.

In operation 306, the word line 220 may be switched from the first voltage 406 to a second voltage 408. The second voltage (e.g., 0 volts) may be low enough that relative to the predetermined voltage 404 applied to the bit line 204 (e.g., 8 volts), a net voltage difference (e.g., 8 volts) may result that is effective to program the memory cell 202. That is, the second voltage 408 may result in a programming voltage. The control circuit 226 may switch between the first voltage 406 and the second voltage 408.

As noted above, the bit line 204 may be long relative to the word line 220. Thus, the switching of the word line 220 may be faster than if the bit line were switched or otherwise controlled.

The foregoing description discloses only exemplary embodiments of the invention. Modifications of the above-disclosed embodiments of the present invention of which fall within the scope of the invention will be readily apparent to those of ordinary skill in the art.

Accordingly, while the present invention has been disclosed in connection with exemplary embodiments thereof, it should be understood that other embodiments may fall within the spirit and scope of the invention as defined by the following claims.

The invention claimed is:

1. A method of programming a two terminal memory cell, comprising;
   providing the memory cell;
   providing a first line connected to the memory cell;
   providing a first line driver connected to the first line;
   providing a first line select to control the first line driver;

providing a control circuit selectively connected to the first line through the first line driver when the first line select is enabled, the control circuit to set the first line to a first voltage from a first line standby voltage;

providing a second line connected to the memory cell;

providing a second line driver connected to the second line;

providing a second line select to control the second line driver; and providing a sense amplifier selectively connected to the second line through the second line driver when the second line select is enabled, the sense amplifier operative to charge the second line to a predetermined voltage from a second line standby voltage, wherein the control circuit switches the first line from the first voltage to the second voltage, wherein a voltage drop across the memory cell, when the first line is set to the first voltage, is a safe voltage that does not program the memory cell, and wherein a voltage drop across the memory cell, after the first line is switched from the first to the second voltage, is a programming voltage that is sufficient to program the memory cell.

2. The method of claim 1, wherein a difference between the safe voltage and the programming voltage is operative to maximize programming speed and operative to distinguish between programming and not programming.

3. The method of claim 1, wherein charging of the second line to the predetermined voltage is without limitation.

4. The method of claim 1, wherein the control circuit includes a dedicated regulator.

5. The method of claim 1, wherein the control circuit includes:
a diode connected NMOS device; and
a bypass path.

6. The method of claim 1, wherein the second line is longer than the first line.

7. The method of claim 1, wherein the memory cell includes chalcogenide.

8. The method of claim 1, wherein the first line includes a word line and the second line includes a bit line.

9. The method of claim 1, wherein the first voltage is higher than the second voltage.

10. A device operative to program a two terminal memory cell, comprising:
a control circuit selectively connected to a first line through a first line driver when a first line select is enabled, the control circuit to set the first line to a first voltage from a first line standby voltage; and
a sense amplifier selectively connected to a second line through a second line driver when a second line select is enabled, the sense amplifier operative to charge the second line to a predetermined voltage from a second line standby voltage,
wherein the control circuit switches the first line from the first voltage to a second voltage,
wherein the first voltage combined with the predetermined voltage is a safe voltage; and
wherein the second voltage combined with the predetermined voltage is a programming voltage.

11. The device of claim 10, wherein a difference between the safe voltage and the programming voltage is operative to maximize programming speed and operative to distinguish between programming and not programming.

12. The device of claim 10, wherein the control circuit includes a dedicated regulator.

13. The device of claim 10, wherein the control circuit includes:
a diode connected NMOS device; and
a bypass path.

14. The device of claim 10, wherein the second line is longer than the first line.

15. The device of claim 10, wherein the first line includes a word line and the second line includes a bit line.

16. The device of claim 10, wherein the first voltage is higher than the second voltage.

17. A memory array including a two terminal memory cell, comprising
the memory cell;
a first line connected to the memory cell;
a first line driver connected to the first line;
a first line select to control the first line driver;
a control circuit selectively connected to the first line through the first line driver when the first line select is enabled, the control circuit to set the first line to a first voltage from a first line standby voltage;
a second line connected to the memory cell;
a second line driver connected to the second line;
a second line select to control the second line driver; and
a sense amplifier selectively connected to the second line through the second line driver when the second line select is enabled, the sense amplifier to charge the second line to a predetermined voltage from a second line standby voltage,
wherein the control circuit switches the first line from the first voltage to a second voltage,
wherein the first voltage combined with the predetermined voltage is a safe voltage that does not program the memory cell, and
wherein the second voltage combined with the predetermined voltage is a programming voltage operative to program the memory cell.

18. The memory array of claim 17, wherein a difference between the safe voltage and the programming voltage is operative to maximize programming speed and operative to distinguish between programming and not programming.

19. The memory array of claim 17, wherein the control circuit includes a dedicated regulator.

20. The memory array of claim 17, wherein the control circuit includes:
a diode connected NMOS device; and
a bypass path.

21. The memory array of claim 17, wherein the second line is longer than the first line.

22. The memory array of claim 17, wherein the memory cell includes chalcogenide.

23. The memory array of claim 17, wherein the first line includes a word line and the second line includes a bit line.

24. The memory array of claim 17, wherein the first voltage is higher than the second voltage.

* * * * *